(12) United States Patent
Imbert et al.

(10) Patent No.: US 10,679,963 B2
(45) Date of Patent: Jun. 9, 2020

(54) METHOD FOR ASSEMBLING TWO SUBSTRATES OF DIFFERENT NATURES VIA A DUCTILE INTERMEDIATE LAYER

(71) Applicant: COMMISSARIAT A L'ENERGIE ATOMIQUE ET AUX ENERGIES ALTERNATIVES, Paris (FR)

(72) Inventors: Bruno Imbert, Grenoble (FR); Lamine Benaissa, Massy (FR); Paul Gondcharton, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 233 days.

(21) Appl. No.: 14/893,396

(22) PCT Filed: May 26, 2014

(86) PCT No.: PCT/EP2014/060789
§ 371 (c)(1),
(2) Date: Nov. 23, 2015

(87) PCT Pub. No.: WO2014/191337
PCT Pub. Date: Dec. 4, 2014

(65) Prior Publication Data
US 2016/0126215 A1  May 5, 2016

(30) Foreign Application Priority Data
May 27, 2013  (FR) .................................. 13 54743

(51) Int. Cl.
*H01L 23/00* (2006.01)
*H01L 21/18* (2006.01)

(52) U.S. Cl.
CPC ............ *H01L 24/83* (2013.01); *H01L 21/187* (2013.01); *H01L 2224/83203* (2013.01);
(Continued)

(58) Field of Classification Search
CPC ....... H01L 24/83; H01L 21/18; H01L 21/187; H01L 2224/83203; H01L 2224/83895;
(Continued)

(56) References Cited

U.S. PATENT DOCUMENTS 4,364,779 A * 12/1982 Kamgar .............. H01L 21/3003
  148/DIG. 24
4,763,828 A    8/1988 Fukaya et al.
(Continued)

FOREIGN PATENT DOCUMENTS

EP    0 147 360 A2    7/1985

OTHER PUBLICATIONS

U.S. Appl. No. 13/808,703, filed Jan. 7, 2013, Deguet et al.
(Continued)

*Primary Examiner* — Charles D Garber
*Assistant Examiner* — S M Sohel Imtiaz
(74) *Attorney, Agent, or Firm* — Oblon, McClelland, Maier & Neustadt, L.L.P.

(57) ABSTRACT

A method for manufacturing a heterostructure, including: contacting a first substrate having a first coefficient of thermal expansion and a second substrate having a different second coefficient of thermal expansion; annealing an assembly formed by contacting the first substrate and the second substrate; after annealing, returning the assembly to room temperature; providing, before the contacting, at least one intermediate layer at a surface of at least one of the first and second substrates, the at least one intermediate layer being made of a material which is ductile during the annealing and returning to room temperature; performing the contacting with the at least one intermediate layer sandwiched between the first and the second substrates; upon returning to room temperature, applying an outer pressure to the assembly to maintain it compressed.

19 Claims, 4 Drawing Sheets

(52) U.S. Cl.
CPC ............... *H01L 2224/83895* (2013.01); *H01L 2924/10253* (2013.01); *H01L 2924/10335* (2013.01); *H01L 2924/3511* (2013.01)

(58) Field of Classification Search
CPC . H01L 2924/10253; H01L 2924/10335; H01L 2924/3511
See application file for complete search history.

(56) References Cited

U.S. PATENT DOCUMENTS

| | | | | |
|---|---|---|---|---|
| 6,877,651 | B2* | 4/2005 | Sandin | B23K 35/3033 228/121 |
| 8,263,475 | B2* | 9/2012 | Radu | H01L 21/2007 257/E21.328 |
| 8,727,203 | B2* | 5/2014 | Wang | A61L 27/06 228/193 |
| 2003/0092246 | A1* | 5/2003 | Wanat | B24B 37/30 438/464 |
| 2006/0240640 | A1* | 10/2006 | Nesterenko | B23K 20/021 438/455 |
| 2008/0296724 | A1* | 12/2008 | Yamazaki | H01L 21/76254 257/506 |
| 2009/0081432 | A1* | 3/2009 | Gomi | B32B 7/10 428/214 |
| 2009/0183825 | A1* | 7/2009 | Sato | B32B 37/00 156/273.3 |
| 2010/0110157 | A1* | 5/2010 | Yonehara | B41J 2/45 347/130 |
| 2010/0323496 | A1* | 12/2010 | Allibert | H01L 21/76254 438/458 |
| 2011/0263131 | A1* | 10/2011 | Katamura | H01L 21/6715 438/758 |
| 2011/0297300 | A1* | 12/2011 | Furuya | C09J 183/04 156/154 |
| 2012/0103515 | A1* | 5/2012 | Endoh | B22F 1/0018 156/325 |
| 2012/0295383 | A1* | 11/2012 | Sugano | B24B 37/042 438/46 |
| 2013/0111719 | A1 | 5/2013 | Deguet et al. | |

OTHER PUBLICATIONS

U.S. Appl. No. 14/901,027, filed Dec. 27, 2015, Signamarcheix et al.

M. Alexe, et al., "Low temperature GaAs/Si direct wafer bonding," Electronics Letters, IEE Stevenage, vol. 36, No. 7, XP006015060, Mar. 30, 2000, pp. 677-678.

Z. L. Liau, et al., "Wafer fusion: A novel technique for optoelectronic device fabrication and monolithic integration," Applied Physics Letters, vol. 56, No. 8, Feb. 1990 (4 pages).

K.N. Chen, et al., "Investigation and Effects of Wafer Bow in 3D Integration Bonding Schemes," Journal of Electronic Materials, vol. 39, No. 12, Dec. 2000, pp. 2605-2510.

M. Hommel, et al., "Deformation Behavior of Thin Copper Films on Deformable Substrates," Acta Materialia, vol. 49, No. 19, Nov. 2001, pp. 3935-3947.

International Search Report dated Jul. 1, 2014 in PCT/EP2014/060789 filed May 26, 2014.

French Search Report dated Jan. 27, 2014 in FR Application 1354743 filed May 27, 2013.

* cited by examiner

METHOD FOR ASSEMBLING TWO SUBSTRATES OF DIFFERENT NATURES VIA A DUCTILE INTERMEDIATE LAYER

TECHNICAL FIELD

The field of the invention relates to the manufacture of heterogeneous structures, referred to as heterostructures, formed by bonding a first substrate and a second substrate which have different coefficients of thermal expansion. Such heterostructures are particularly used in microelectronics or optoelectronics, for example in response to problems such as 3D-integration of components, microelectromechanical systems (MEMS) encapsulation, or even the transfer of components on metallic bases.

The invention is more particularly intended to control the deformation that such heterostructures are likely to have at room temperature when they have been submitted to thermal annealings, so as in particular to minimize this deformation.

STATE OF PRIOR ART

It is known that the annealings applied to assemblies of materials having different thermal expansion properties result in the occurrence of a macroscopic deformation, in particular of the plate curvature type, which can prove to be incompatible with the subsequent microelectronics methods on these assemblies (such as for example fixing plates in chambers, handling the machines by robots, flatness of methods of the back face deposition, etc.).

Thus, bonding for forming a heterostructure has been investigated for a long time in the optoelectronics field, with for example the bonding of gallium arsenide (AsGa) on silicon (Si). The article by M. Alexe et al. entitled "Low temperature GaAs/Si direct wafer bonding", Electronics Letters, Vol. 36, Issue 7, thus presents the manufacture of an AsGa/Si heterostructure by adding a silicate glass interfacial layer. This assembly has a temperature resistance up to a temperature measured at 280° C., temperature beyond which the heterostructure breaks. This article also shows that the increase in the thermal budget applied to the heterostructure, besides increasing the hot stresses, finally enables the bonding energy of the heterostructure to be increased.

Manufacturing a heterostructure formed by stacking indium phosphide (InP) on gallium arsenide (AsGa) is described in the article by Z. L. Liau and D. E. Mull, "Wafer fusion: A novel technique for optoelectronic device fabrication and monolithic integration", *Applied Physics Letters*, vol. 56, no 8, p. 737-739, February 1990. This heterostructure, manufactured by the method of thermal compression-aided direct bonding at temperatures equal to or greater than 520° C., has however a curvature. Although this article does not give a precise assessment of the curvature, performing a simulation of the deflection evolution of an InP/AsGa heterostructure as a function of the temperature makes it possible to demonstrate that for an annealing beyond 500° C., the deflection is close to 1 mm for substrates having a diameter of 100 mm, that is a radius of curvature in the order of 1.25 metre.

Copper-copper thermal compression-aided bonding is also known from those skilled in the art. The article by K. N. Chen, Y. Zhu, W. W. Wu, and R. Reif, "Investigation and Effects of Wafer Bow in 3D Integration Bonding Schemes", Journal of Electronic Materials, vol. 39, no 12, p. 2605-2610, December 2010, thus mentions that bonding plates having a diameter of 200 mm one of which has a deflection, is possible up to deflection values of 100 µm. However the bondings obtained through this method have a post-bonding deflection of a value equivalent to the deflection of the curved plate.

Prior arts described in particular in these articles do not therefore provide a solution to the problem of occurrence, during the annealing of the heterostructures, of a macroscopic deformation which can prove to be incompatible with performing subsequent microelectronics methods on the heterostructures.

DISCLOSURE OF THE INVENTION

The invention is intended to provide an inexpensive method for assembling two substrates having different coefficients of thermal expansion, which can enable to manufacture a heterostructure with a controlled deformation and especially a reduced deformation, in particular a heterostructure having a radius of curvature greater than 1.5 metre and advantageously greater than 80 metres, compatible with the manufacture of subsequent microelectronics methods on the assembly.

To do so, the invention provides a method for manufacturing a heterostructure, comprising the steps of:
  contacting a first substrate with a first coefficient of thermal expansion and a second substrate having a second coefficient of thermal expansion different from the first coefficient of thermal expansion,
  annealing the assembly formed by contacting the first substrate and the second substrate,
  after annealing, returning said assembly to room temperature, characterised by:
  providing, before said contacting, at least one intermediate layer at the surface of at least one of the first and second substrates, said at least one intermediate layer being made of a material which is ductile during the steps of annealing and returning to room temperature,
  performing the contacting with the at least one intermediate layer sandwiched between the first and the second substrates,
  upon returning to room temperature, applying an outer pressure to said assembly in order to compress said assembly.

Certain preferred but non-limiting aspects of the method are as follows:
  the annealing is implemented during a thermal compression-aided bonding of the first and second substrates contacted with the at least one intermediate layer sandwiched between them;
  the contacting is a direct bonding (non-thermocompressive) of the first and second substrates with the at least one intermediate layer sandwiched between them, and the annealing is a bonding strengthening annealing;
  it further comprises a compression of said assembly implemented during at least a part of said bonding strengthening annealing;
  upon returning to room temperature, the assembly is compressed by applying an outer uniaxial pressure;
  the uniaxial pressure is substantially uniform on the whole assembly so that the assembly is maintained with a radius of curvature greater than 10 m, and advantageously greater than 80 m;
  before contacting the first and second substrates, a softening of said at least one intermediate layer is performed to reduce the yield strength thereof;
  softening is performed by thermal annealing, or by modifying the microstructure of the at least one intermediate layer;

it comprises, before contacting, forming, by implanting atomic species, an embrittlement area inside the first substrate, and after contacting, thinning the first substrate by a separation from said first substrate at the embrittlement area;

the first and second substrates are made of materials which are in their state of elastic deformation during the steps of annealing and returning to room temperature;

the at least one intermediate layer is a layer deposited on the surface of at least one of the first and second substrates;

the first substrate is a silicon substrate, the second substrate is an indium phosphide substrate, and the at least one intermediate layer is a copper layer;

the at least one intermediate layer is a surface layer of the second substrate;

the first substrate is a silicon substrate, and the second substrate is a copper substrate.

BRIEF DESCRIPTION OF THE DRAWINGS

Further aspects, objectives, advantages, and characteristics of the invention will better appear upon reading the following detailed description of preferred embodiments thereof, given by way of non-limiting example, and made with reference to the appended drawings on which.

DETAILED DISCLOSURE OF PARTICULAR EMBODIMENTS

With reference to FIGS. 1a-1e and FIGS. 3a-3f, the invention relates to a method for manufacturing a heterostructure H comprising at least one intermediate layer 2 sandwiched between a first substrate 1 having a first coefficient of thermal expansion and a second substrate 3 having a second coefficient of thermal expansion different from said first coefficient of thermal expansion at least in one of the orientations of the substrates, typically by at least 10% or 20% at room temperature. Such a difference induces stresses within the heterostructure when the latter undergoes a thermal treatment.

By way of illustrating example, at room temperature (20° C.), the coefficient of thermal expansion of silicon is $3 \cdot 10^{-6}$ $C^{-1}$ whereas the one of indium phosphide is $4.6 \cdot 10^{-6}$ $C^{-1}$.

Figure 1A:
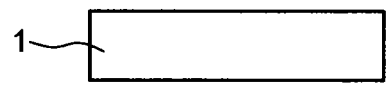
FIGS. 1a-1e illustrate a first alternative of a possible embodiment of the method according to the invention.
Figure 1B:
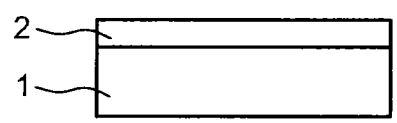
Figure 3A:
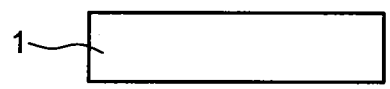
FIGS. 3a-3f illustrate a second alternative of a possible embodiment of the method according to the invention.
Figure 3B:
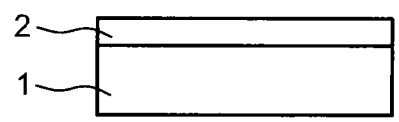

Starting as shown in FIGS. 1a and 3a with a first substrate 1, the method includes a first step of providing at least one intermediate layer at the surface of at least one of the first and second substrates. In FIGS. 1b and 3b, providing an intermediate layer 2 at the surface of the first substrate 1 is shown.

The intermediate layer 2 can be a layer deposited on either or both of the substrates 1, 3. The intermediate layer 2 can be a surface layer of one of the substrates.

By way of illustrating example, the intermediate layer 2 is a copper layer with a thickness between 50 nm and 10 μm deposited on either or both of the substrates 1, 3.

In an embodiment, a barrier layer can be interposed between one of the substrates and the intermediate layer provided at the surface of said substrate in order to prevent the diffusion of the material of the intermediate layer in the substrate in particular during the subsequent steps of thermal treatment. By way of illustrating example, a barrier layer of titanium nitride or tantalum nitride can be interposed between a silicon substrate and an intermediate copper layer to prevent copper from diffusing in silicon.

The intermediate layer 2 exhibits particular thermomechanical properties as will be detailed later.

Figure 1C:
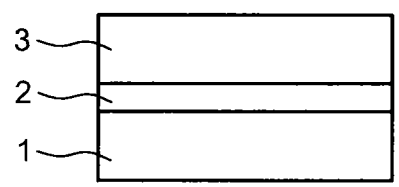
Figure 3C:
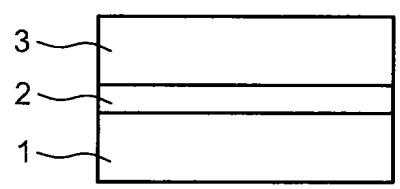

With reference to FIGS. 1c and 3c, the method then includes a step of contacting the first and second substrates performed such that the at least one intermediate layer is sandwiched between the first and second substrates.

The first substrate and the second substrate contacted at room temperature are then submitted to an annealing (bonding annealing or bonding strengthening annealing as will be exemplified later), before the assembly obtained after annealing is brought back to room temperature.

Within the scope of the invention, said assembly is maintained under pressure by applying an outer pressure, for example by applying a full plate or localized outer uniaxial pressure, upon returning to room temperature. This enables the flatness (radius of curvature typically greater than 10 m, even 80 m) to be maintained during the temperature lowering, a plastic deformation of the intermediate layer to be induced and thus the deflection of the heterostructure to be limited at room temperature. The invention is however not limited to such a flatness maintenance but also extends to a maintenance under pressure by applying an outer pressure upon returning to room temperature performed so as to provide a given radius of curvature to the heterostructure, typically by means of a press the surface in contact with the heterostructure of which is not planar but curved for this purpose.

Figure 1D:
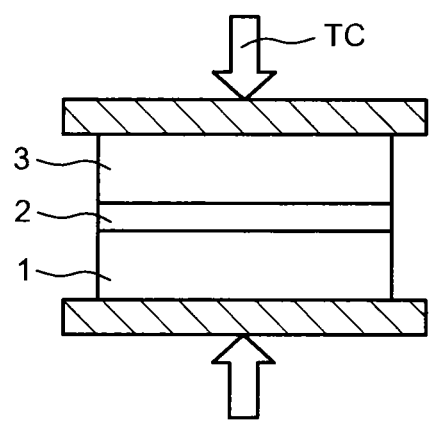
Figure 1E:
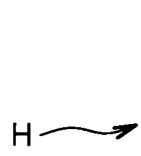
Figure 2:
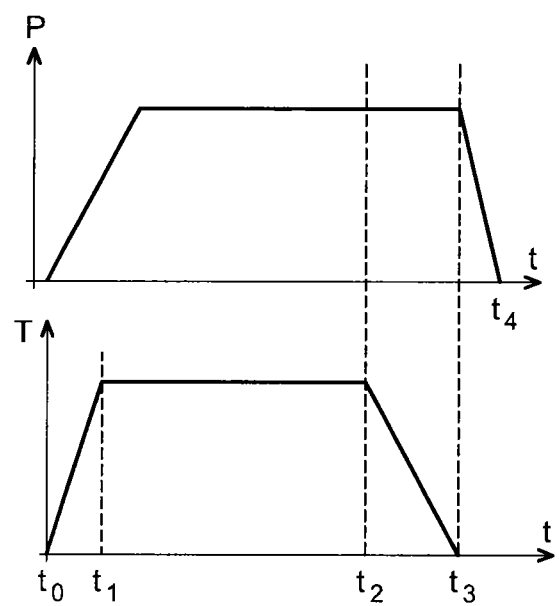
FIG. 2 illustrates the evolution over time of the temperature and the pressure applied to the heterostructure within the scope of the first alternative of FIGS. 1a-1e.

In a first alternative embodiment illustrated by FIGS. 1a-1e and by FIG. 2, the contacted substrates do not adhere to each other at room temperature, for example in the absence of operations for preparing the surface of the substrates before their contacting. With reference to FIG. 1d, a thermal compression TC-aided bonding of the contacted substrates is then performed, the above-mentioned annealing being therefore performed during thermal compression. As represented in FIG. 2, the annealing T can be performed between 30° C. and 400° C. for a duration typically greater than 30 minutes for an annealing around 200° C. (as a function of the present materials). The annealing T can be performed at a constant temperature over a period t1-t2, with a prior phase of temperature raise from room temperature over a period t0-t1, and a subsequent phase of temperature lowering over a period t2-t3. As previously indicated, the assembly obtained at the end of the annealing is compressed upon returning to room temperature, for example by applying a substantially uniform uniaxial pressure on the assembled substrates between 0.1 and 7.64 MPa, especially by using the same apparatus as the one used to perform the thermal compression-aided bonding. The pressure P applied to the contacted substrates is thus not only applied to perform the thermal compression-aided bonding, but also applied upon returning to room temperature over the period t2-t3. Only after t3 the pressure is released. With reference to FIG. 1e, the desired heterostructure H with a nearly zero deflection is reached. Within the scope of this first alternative, providing an intermediate layer on each of the substrates 1, 3 can be advantageously resorted to, which facilitates thermal compression-aided bonding.

Figure 3D:
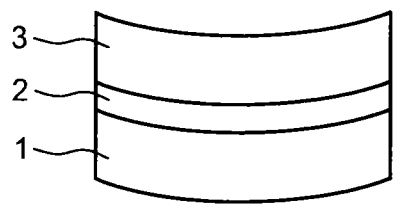
Figure 3E:
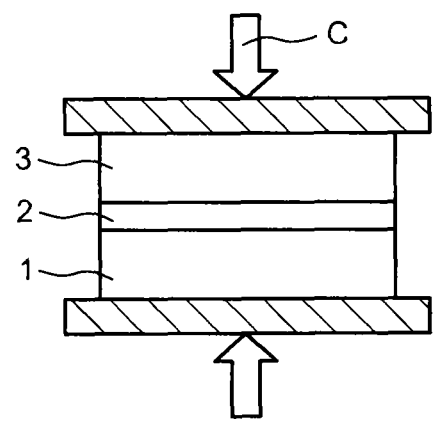
Figure 3F:
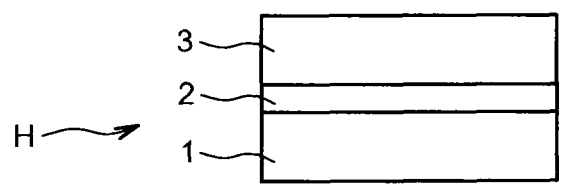
Figure 4:
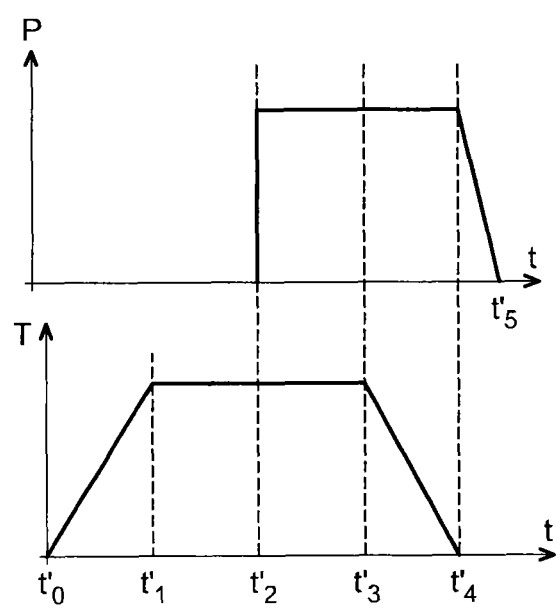
FIG. 4 illustrates the evolution over time of the temperature and the pressure applied to the heterostructure within the scope of the second alternative of FIGS. 3a-3f.

In a second alternative embodiment illustrated by FIGS. 3a-3f and by FIG. 4, the contacted substrates adhere to each other (non-thermocompressive direct bonding) at room temperature, for example due to operations for preparing the surface of the substrates performed before their contacting. The bonding energy is however relatively low and incompatible with the needs of the final application in terms of mechanical strength such that a bonding strengthening annealing must be applied to the thus bonded substrates. As represented in FIG. 4, this annealing T can be performed at a constant temperature over a period t'1-t'3, for example around 200° C. during 30 minutes, with a prior phase of temperature raise from the room temperature over a period t'0-t'1, and a subsequent phase of temperature lowering over a period t'3-t'4. As previously indicated, and as represented in FIG. 3e, the assembly obtained at the end of the annealing is compressed upon returning to room temperature over the period t'3-t'4 by applying a pressure P.

As represented in FIG. 3d, performing a bonding strengthening annealing creates a deformation of the heterostructure, which deformation conventionally causes the breaking of the heterostructure upon the restoration to room temperature. The maintenance under pressure during the restoration to room temperature by applying an outer pressure and the choice of the ductile intermediate layer enable as represented in FIG. 3f the desired heterostructure H with a near-zero deflection to be obtained.

Within the scope of this second alternative, annealing can be performed with a greater thermal budged (for example over a period t'1-t'3 rather than over a period t'1-t'2 as illustrated in FIG. 4) than a budget which leads to the breaking of the heterostructure when it has been manufactured according to a standard direct bonding method. And compression P can be applied not only during the temperature lowering, but also during at least part of the annealing, as is the case over the period t'2-t'3 in FIG. 4.

Thus, the annealing of the method according to the invention can be performed during a thermal compression. It can alternatively take place as an annealing in a conventional oven, such as an annealing implemented according to a conventional direct bonding.

Within the scope of the invention, an intermediate layer is used, made of a material exhibiting thermomechanical properties such that the deformation strains of the assembly, induced by the stresses generated by the difference of coefficient of thermal expansion of the first and second substrates and by the pressurization of the assembly upon returning to room temperature, can be absorbed by said intermediate layer. For this, the intermediate layer undergoes a plastic deformation which enables said deformation strains to be dissipated, for example by generating structural defects in said intermediate layer.

By way of illustrating example, the intermediate layer is a metal layer, for example an aluminium, gold, silver, titanium, or copper layer. In this respect, the article by M. Hommel and O. Kraft, "Deformation behaviour of thin copper films on deformable substrates", Acta Materialia, vol. 49, no 19, p. 3935-3947, November 2001, can be referred to, in which it was demonstrated that thin copper layers (between 0.2 and 5 µm) are able to store significant stresses by plastic deformation. Indeed, copper, when under the form of thin polycrystalline layers, is able to enter its plastic domain under very low applied stresses. It will then "store" the tensile or compression strains by creating dislocations in these grains.

The intermediate layer is thus made of a material which is ductile during the steps of annealing and returning to room temperature. For the stress exerted during these steps, the intermediate layer is thus in its state of plastic deformation (irreversible deformation state which does not lead to the material breaking). The stress $C_{rm}$ for which its breaking tensile strength is reached is thus greater than the stress $C_i$ induced by the difference in the coefficients of thermal expansion of the first and second substrates and by maintaining under pressure the assembly upon returning to room temperature. The stress $C_e$ for which its yield strength is reached is lower than said induced stress $C_i$.

The thickness of the intermediate layer is advantageously chosen so that it can absorb said induced stress $C_i$, the layer being typically all the more thicker as the induced stress is significant.

The first and second substrates are preferably made of materials which are in their state of elastic deformation during the steps of the method. In other words, the induced stress $C_i$ exerted on the assembly is lower than the stress for which the yield strength is reached for each of the first and second substrates.

It is reminded that the yield strength of a material can be determined by measuring the nanoindentation which enables the access to the hardness value of the material and to the value of its yield strength through the Tabor formula.

In an embodiment of the invention, an intermediate layer is used as a thin layer the breaking tensile strength of which can be compared to a near infinite point, such as for example a copper layer with a thickness lower than 10 µm.

The maintenance under pressure of the assembly during temperature lowering towards room temperature leads the intermediate layer to transfer the stresses due to the differences in the coefficients of thermal expansion (observable through the creation of a deflection in the conventional methods) into intrinsic stresses quantifiable through the creation of crystal defects of the vacancies, dislocations, etc. type in the microstructure of the intermediate layer (strain-hardening of the layer as observed in metallurgy). The intermediate layer thus has to exhibit a thickness greater than a minimum thickness where it cannot enter a state of plastic deformation while accepting the formation of crystal defects. By way of example, this minimum thickness is in the order of 50 nm for copper.

The invention thus makes it possible to perform a hot bonding of two different substrates at a temperature where conventionally the restoration to room temperature leads to the breaking of the assembly obtained after bonding. Besides, the invention makes it possible to integrate into a method for manufacturing a heterostructure, a step of post-bonding annealing which enables a better adhesion of the performed bonding, and in particular an annealing which can be performed for thermal budgets which conventionally lead to the breaking of the heterostructure or to the formation of a residual deflection when the heterostructure is manufactured according to a standard direct bonding method.

In an embodiment, the intermediate layer is softened (in other words, its hardness is reduced) before contacting the substrates in order to reduce the yield strength thereof and thus improve its capacity of absorbing plastic deformations. This softening of the intermediate layer can be performed through thermal annealing. It can also consist in modifying the microstructure of the intermediate layer, especially by increasing the size of the grains.

In an embodiment, the method according to the invention comprises, before contacting the substrates, the steps of forming by implanting atomic species of an embrittlement area inside the first substrate, and of thinning, after contacting, the first substrate by separation of said first substrate at the embrittlement area. By thus implementing this Smart Cut™ technology within the scope of the method according to the invention, the successive transfer of a layer on another substrate can be performed in spite of different coefficients of thermal expansion.

Exemplary embodiments of the invention are as follows. In a first example, an InP/Si heterostructure is formed with an intermediate copper layer on each of the substrates. After thermal compression-aided bonding at a temperature of 250° C. and a pressure of 3.82 MPa for 1 h, the assembly obtained after bonding exhibits a deflection of 200 µm (for substrates of 100 mm). By implementing the invention through maintaining, during the temperature lowering, the assembly under a pressure of 3.82 MPa, a near zero deflection in the order of 6 µm is obtained.

In a second example, a Cu/Si heterostructure is formed. After thermal compression-aided bonding at a temperature of 250° C. and a pressure of 3.82 MPa for 1 h, the assembly obtained after bonding exhibits a deflection of 1100 µm (for substrates with a 100 mm diameter). If the assembly does not break, the substrates follow the curvature, which a slow temperature lowering of 1° C./min does not make it possible to limit. By implementing the invention with an intermediate layer taking the shape of a surface layer of the copper substrate, another intermediate copper layer at the surface of the silicon substrate and by maintaining, during the post-bonding temperature lowering of the assembly, under a pressure of 6.37 MPa, the deflection is diminished by 300 µm. A radius of curvature in the order of 1.6 m is thus obtained.

The table below gives different examples of heterostructures that can be manufactured by the method according to the invention by means of substrates having different coefficients of thermal expansion.

|  | Si | Sapphire | quartz | Ge | LiNbO3 | LiTaO5 | GaAs | SiC | Poly-crystalline Si | InP |
|---|---|---|---|---|---|---|---|---|---|---|
| Si | ok | ok | ok | ok | ok | ok | ok | ok | ok | ok |
| Sapphire |  | ok | ok | ok | ok | ok | ok | ok | ok | ok |
| quartz |  |  | ok | ok | ok | ok | ok | ok | ok | ok |
| Ge |  |  |  | ok | ok | ok | ok | ok | ok | ok |
| LiNbO3 |  |  |  |  | ok | ok | ok | ok | ok | ok |
| LiTaO5 |  |  |  |  |  |  | ok | ok | ok | ok |
| GaAs |  |  |  |  |  |  |  | ok | ok | ok |
| SiC |  |  |  |  |  |  |  |  | ok | ok |
| Poly-crystalline Si |  |  |  |  |  |  |  |  |  | ok |

The invention claimed is:

1. A method for manufacturing a heterostructure, the method comprising:
   contacting a first substrate and a second substrate with at least one intermediate layer sandwiched between the first and second substrates, thereby forming an assembly;
   annealing the assembly at an annealing temperature greater than room temperature; and
   after the annealing, applying and maintaining a uniaxial outer pressure to the assembly to compress the assembly while cooling the assembly to room temperature, thereby forming a bonded structure of the first and second substrates;
   wherein
   the first substrate has a first coefficient of thermal expansion,
   the second substrate has a second coefficient of thermal expansion different from the first coefficient of thermal expansion,
   the at least one intermediate layer is present at a surface of at least one of the first substrate and the second substrate before the contacting, and
   the at least one intermediate layer is a metal layer which is ductile during the annealing and the cooling to room temperature.

2. The method according to claim 1, wherein the annealing is implemented during a thermal compression aided bonding of the first and second substrates with the at least one intermediate layer sandwiched between the first and second substrates.

3. The method according to claim 1, wherein
   the contacting is a direct bonding of the first and second substrates with the at least one intermediate layer sandwiched between the first and second substrates, and
   the annealing is a bonding strengthening annealing.

4. The method according to claim 3, further comprising compressing the assembly during at least part of the bonding strengthening annealing.

5. The method according to claim 1, wherein a radius of curvature of the assembly is maintained greater than 10 meters during the cooling to room temperature.

6. The method according to claim 1, further comprising:
   before the contacting, softening the at least one intermediate layer to reduce a yield strength thereof.

7. The method according to claim 6, wherein the softening is performed by thermal annealing.

8. The method according to claim 6, wherein the softening is performed by modifying microstructure of the at least one intermediate layer.

9. The method according to claim 1, further comprising:
   before the contacting, forming, by implanting atomic species, an embrittlement area inside the first substrate, and
   after the contacting, thinning the first substrate by separating the first substrate at the embrittlement area.

10. The method according to claim 1, wherein the first and second substrates are substrates of materials which are in a state of elastic deformation during the annealing and the cooling to room temperature.

11. The method according to claim 1, wherein the at least one intermediate layer is a layer deposited on the surface of at least one of the first and second substrates.

12. The method according to claim 11, wherein the first substrate is a silicon substrate, the second substrate is an indium phosphide substrate, and the at least one intermediate layer is a copper layer.

13. The method according to claim 1, wherein the at least one intermediate layer is a surface layer of the second substrate.

14. The method according to claim 13, wherein the first substrate is a silicon substrate, and the second substrate is a copper substrate.

15. The method according to claim 1, wherein a radius of curvature of the assembly is maintained greater than 80 meters during the cooling to room temperature.

16. The method according to claim 1, wherein a barrier layer is interposed between the at least one intermediate layer and one of the first and second substrates.

17. The method according to claim 1, wherein the uniaxial outer pressure ranges from 0.1 to 7.64 MPa.

18. The method according to claim 1, wherein the annealing temperature ranges from 30° C. to 400° C.

19. The method according to claim 1, wherein the annealing temperature ranges from 200° C. to 400° C.

* * * * *